United States Patent
Tonosaki et al.

(10) Patent No.: US 7,213,338 B2
(45) Date of Patent: *May 8, 2007

(54) COOLER, ELECTRONIC APPARATUS, AND METHOD FOR FABRICATING COOLER

(75) Inventors: Minehiro Tonosaki, Kanagawa (JP); Naoki Sano, Kanagawa (JP); Takuya Makino, Chiba (JP)

(73) Assignee: Sony Corporation, Tokyo (JP)

( * ) Notice: Subject to any disclaimer, the term of this patent is extended or adjusted under 35 U.S.C. 154(b) by 29 days.

This patent is subject to a terminal disclaimer.

(21) Appl. No.: 11/133,743

(22) Filed: May 20, 2005

(65) Prior Publication Data

US 2005/0213303 A1 Sep. 29, 2005

Related U.S. Application Data

(62) Division of application No. 10/250,528, filed as application No. PCT/JP02/12643 on Dec. 13, 2001, now Pat. No. 6,999,314.

(30) Foreign Application Priority Data

Dec. 13, 2001 (JP) .......................... P2001-380561

(51) Int. Cl.
*B21D 53/06* (2006.01)
*B21D 53/02* (2006.01)

(52) U.S. Cl. ............................. 29/890.035; 29/890.03; 29/890.032; 361/700; 361/699; 257/714; 257/715; 165/104.26

(58) Field of Classification Search ............. 29/890.03, 29/890.032, 890.035; 361/700, 699; 165/104.26, 165/104.14; 257/714, 715
See application file for complete search history.

(56) References Cited

U.S. PATENT DOCUMENTS 4,322,737 A * 3/1982 Sliwa, Jr. .................... 257/719

| | | | | |
|---|---|---|---|---|
| 4,602,679 A | * | 7/1986 | Edelstein et al. | 165/104.26 |
| 4,880,052 A | * | 11/1989 | Meyer et al. | 165/104.14 |
| 5,159,529 A | * | 10/1992 | Lovgren et al. | 361/699 |
| 5,168,921 A | * | 12/1992 | Meyer, IV | 165/104.14 |
| 6,133,631 A | * | 10/2000 | Belady | 257/714 |
| 6,785,135 B2 | * | 8/2004 | Ohmi et al. | 361/700 |

FOREIGN PATENT DOCUMENTS

| JP | 11-201668 | 7/1999 |
|---|---|---|
| JP | 2000-035293 | 2/2000 |

* cited by examiner

*Primary Examiner*—Marc Jimenez
(74) *Attorney, Agent, or Firm*—Sonnenschein Nath & Rosenthal LLP

(57) ABSTRACT

This invention provides a cooler having an excellent cooling performance, which is capable of being downsized and low-profiled, an electronic apparatus and a method for fabricating the cooler. The cooler (1) comprises lower board member (10) and upper complex board members. The lower board member (10) is made from plastic material and has a cavity portion (11) for allowing water or vapor to be circulated therein. The upper complex board members comprise board member (20) for a condenser part, upper board member (30), and board member (40) for a wick part. The board members (20) and (40) for the condenser part and the wick part, respectively, are made from metallic material having higher thermal conductivity such as copper and nickel. Each of the members has a groove for allowing them to be served as the condenser and the wick. The upper board member (30) includes an opening (32) or (34) for allowing the board member (20) or (40) for the condenser part or the wick part to be incorporated, and a hollow (31) for heat insulation.

4 Claims, 8 Drawing Sheets

F I G. 1 2
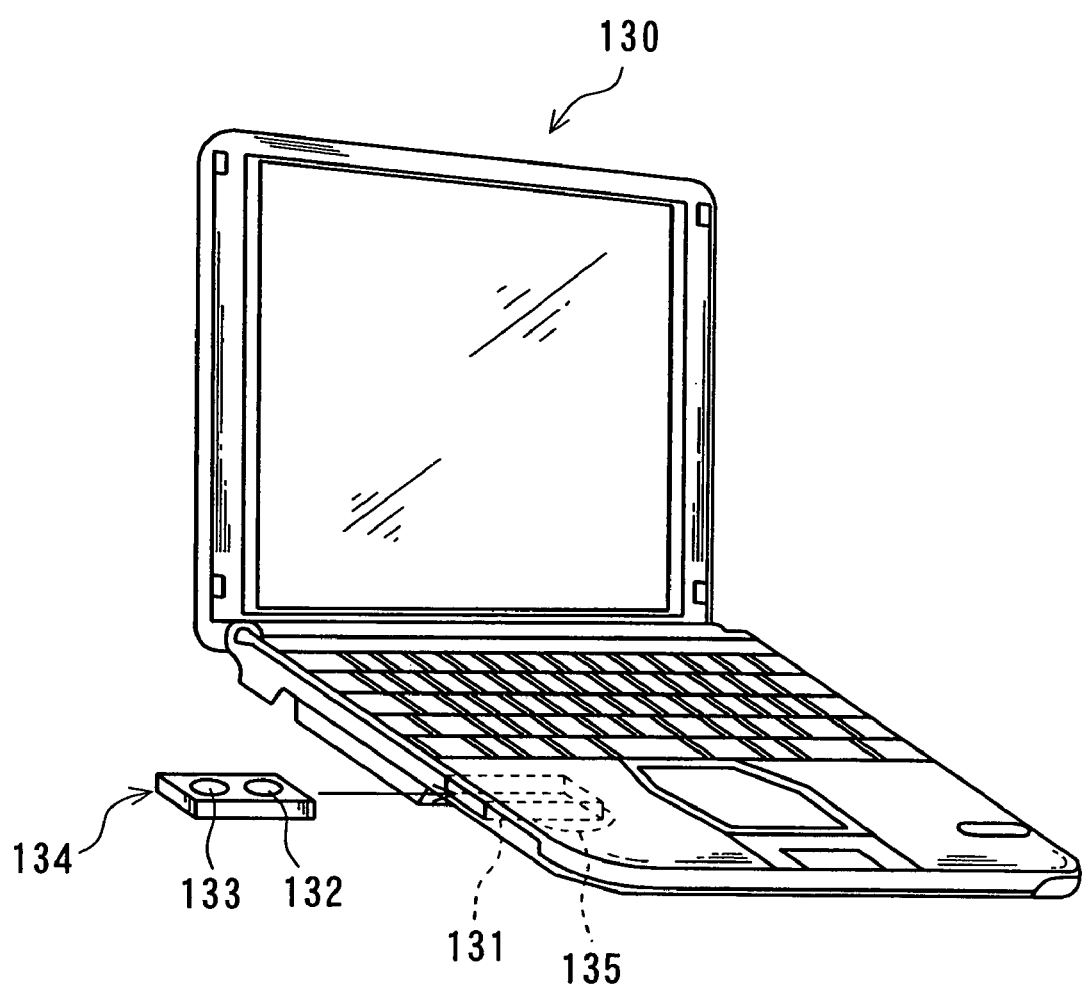

COOLER, ELECTRONIC APPARATUS, AND METHOD FOR FABRICATING COOLER

RELATED APPLICATION DATA

This application is a divisional of application Ser. No. 10/250,528 filed Jun. 30, 2003, now U.S. Pat. No. 6,999,314. The present and foregoing applications claim priority to Japanese Application No. P2001-380561 filed on Dec. 13, 2001, and PCT application No. PCT/JP02/12643. Each of these applications is incorporated herein by reference to the extent permitted by law.

BACKGROUND OF THE INVENTION

The present invention relates to a cooler for transferring heat generated from a driver for card-typed storage medium as a component in a personal computer, a digital camera, and the like, to cool the storage medium, and a method for fabricating the cooler. The present invention also relates to an electronic apparatus such as a personal computer, and a digital camera, which is equipped with the cooler.

BACKGROUND ART

Since a compact and low-profile storage medium such as a memory stick (registered trademark), smart media (registered trademark), and a compact flash (registered trademark) as compared with conventional one such as a floppy (registered trademark) disks may have a large amount of storage capacity, the storage medium has been generically used in an electronic apparatus such as a personal computer, and a digital camera.

In such the storage medium, there are memories wherein a driver and a flash memory are integral parts, and wherein a driver is provided with a memory main body or another card-typed memory, for example. At any rate, this storage medium has recently had a considerable amount of storage capacity.

Such the considerable amount of storage capacity of the storage medium causes the driver to generate a great amount of heat, thereby resulting in a malfunction therein.

In order to avoid the malfunction, it is conceivable that a cooler will be provided with the electronic apparatus side wherein a technology using a heat pipe is used as cooling method.

The heat pipe is a metallic pipe having a wick structure on an inside wall thereof, maintained under vacuum, and filled with a small amount of water, alternatives for chlorofluorocarbons or the like. An end of the heat pipe is attached to heat source to be heated and a working fluid then evaporates or is vaporized in the heat pipe, whereby heat is acquired as latent heat (of evaporation). The vapor is moved toward a low-temperature portion thereof rapidly (almost at the velocity of sound) and it then turns back to a liquid condition by cooling of the low-temperature portion and extracts heat (liberated heat as latent heat when vapor condenses). The working fluid returns to its original position through the wick structure (or by gravity) so that heat transfer can be successively performed with efficiency.

Since the conventional heat pipe has a pipe shape and occupies a large space, it is unsuitable for a cooler for an electronic apparatus such as a personal computer, and a digital camera because the cooler is required to be downsized and low-profiled.

In order to downsize the heat pipe, a cooler has proposed such that silicon and glass board members each having grooves on their mating surfaces are connected together to form a passage between them as the heat pipe. Note that as connecting them, the passage is filled with a small amount of water, alternatives for chlorofluorocarbons or the like and sealed. Such the liquid changes in phase into and from the vapor inside the heat pipe, thereby serving as the heat pipe.

If, however, the heat pipe is formed using the silicon board member as described above, an object to be cooled diffuses too much heat because of high thermal conductivity of silicon itself. This causes inadequate or no evaporation of the working liquid inside the heat pipe, thereby failing to suitably deliver a performance of the heat pipe.

In order to improve the inconvenience, the inventors have proposed such a technology that a plastic board member having low thermal conductivity can be used instead of silicon board member, thereby preventing the heat from being improperly diffused at a surface of the board member to allow a performance of the heat pipe to improve.

In this case, however, it is difficult to transfer the heat from an object to be cooled into the working liquid inside the heat pipe because of low thermal conductivity of the plastic material itself, thereby resulting in inadequate evaporation of the working liquid inside the heat pipe. This may fails to suitably deliver a performance of the heat pipe.

SUMMARY OF THE INVENTION

The present invention has been contrived in the above circumstances and an object of the present invention is to provide a cooler having an excellent cooling performance, which is capable of being downsized and low-profiled, an electronic apparatus and a method for fabricating the cooler.

A cooler according to first aspect of the present invention comprises first board member having a cavity portion formed on a surface thereof, the cavity portion corresponding to a part of a heat pipe excluding at least a wick part (a structure for allowing capillary action to be generated) therefrom, second board member having at least a groove for the wick part formed on a surface thereof, the second board member being made from material having higher thermal conductivity than the first board member has, the surface of the second board member being adhered to the first board member, and third board member incorporating the second board member through a surface thereof, the surface of the third board member being adhered to the first board member.

According to the invention, the first and third board members are adhered to each other. Their surfaces opposed to each other are matched so that the cavity portion can be served as a passage for heat pipe. This allows the cooler to be downsized and low-profiled. Since the wick part is made from the material having higher thermal conductivity such as copper and nickel, thermal transfer can be effectively performed in this part. Additionally, a condenser part and the wick part are removable and the condenser part is also made from material having higher thermal conductivity such as copper and nickel. This allows a cooling performance of the heat pipe to be improved. Since the first and third board members are made from plastic or glass material, they are available for being processed in actuality. They, however, have poor adhesion properties. According to the invention, an adhesive member is provided between the first and third board members to complement their adhesion properties. Incidentally, as a combination of the first and third board members in this case, both members are preferably glass or plastic board members. It is also preferable that one is glass board member and the other is plastic board member. Further, as a matter of course, silicon board member is available. If taking a cost performance, a suitable assembly, and the like into account, silicon, copper and the like may be preferably used as the suitable adhesive.

An electronic apparatus according to second aspect of the invention comprises a slot portion into which a card-typed storage medium having a flush memory and a driver is detachably inserted, or a driver provided with the device side or a driver equipped with a portion separated from the device, and a cooler having the above configuration for transferring heat generated from the driver.

In the invention, the above configured cooler having an excellent cooling performance, which is downsized and low-profiled, is equipped with the electronic apparatus. This prevents the apparatus itself from suffering from thermal malfunction.

A method for fabricating a cooler according to third aspect of the invention comprises the steps of forming first board member having a cavity portion on a surface thereof the cavity portion corresponding to a part of a heat pipe excluding at least a wick part therefrom, forming second board member having at least a groove for the wick part on a surface thereof, said second board member being made from material having higher thermal conductivity than said first board member has, incorporating the second board member to third board member through a surface thereof, and adhering a surface of the third board member to a surface of the first board member. According to the invention, it is possible to effectively fabricate the cooler having the above configuration with reliability.

According to an embodiment of the invention, in the method for fabricating the cooler, the steps of forming fourth board member having at least a groove for a condenser part on a surface thereof, the forth board member being made form material having higher thermal conductivity than the first board member has, and incorporating the forth board member to the third board member through a surface thereof are provided. According the embodiment having such the configuration, the condenser part also has higher thermal conductivity. This allows heat to be much transferred.

According to another embodiment of the invention, in the method for fabricating the cooler, the second board member or the fourth board member is formed under a process of UV-Lithografie Galvanoformung Abformung (UV-LIGA). According the embodiment having such the configuration, it is possible to effectively form a narrow groove.

Finally, according to further embodiment of the invention, in the method for fabricating the cooler, a step of forming adhesive members on any of a surface of the first board member and a surface of the third board member to adhere the first and third board members is further provided. This allows an adhesion between the first and third board members with reliability.

BRIEF DESCRIPTION OF THE DRAWINGS

FIG. 12 is a schematic perspective view of a personal computer equipped with a cooler according to the invention.

DETAILED DESCRIPTION OF THE PRESENTLY PREFERRED EMBODIMENTS

Embodiments of the present invention will be described more in detail with reference to the drawings.

(Cooler)

Figure 1:
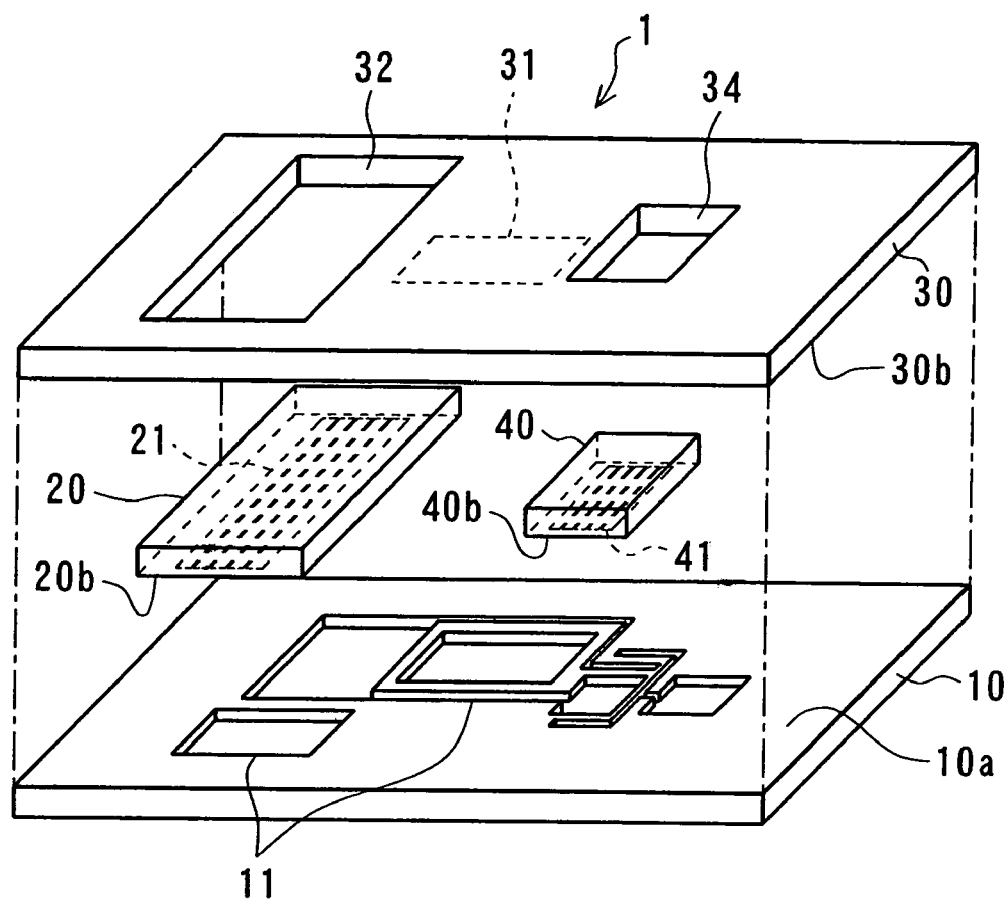
FIG. 1 is an exploded perspective view illustrating a configuration of a cooler embodying the invention.
Figure 2:
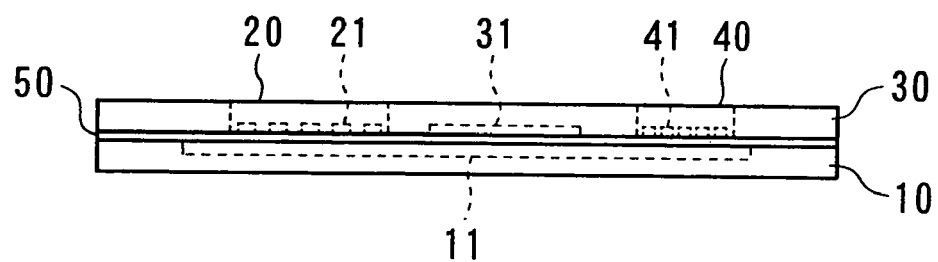
FIG. 2 is a side view illustrating an assembled condition of the cooler embodying the invention.

FIG. 1 is an exploded perspective view of a cooler embodying the invention and FIG. 2 is a side view illustrating an assembled condition of the cooler.

As shown in FIGS. 1 and 2, the cooler 1 comprises four board members 10, 20, 30 and 40. Lower board member 10 is made from plastic material and has a rectangular shape, which is set on a lower location. The board member 20 for a condenser part and the board member 40 for a wick part are made from metallic material such as nickel and have a rectangular shape, respectively. The upper board member 30 is made from plastic material and has a rectangular shape, which is set on an upper location. The board member 20 for the condenser part and the board member 40 for the wick part are inserted into openings 32 and 34 of the upper board member 30, respectively, with them being made integral thereto. These four board members 10, 20, 30 and 40 are adhered and fixed through an adhesive member such as silicon member 50. The respective board members 10, 20, 30 and 40 have a cavity portion 11, a groove 21, a hollow portion 31 and a groove 41 at their surfaces, 10a, 20b, 30b and 40b. The cavity portion 11, the groove 21, the hollow portion 31, and the groove 41 are formed so that they can be served as a looped heat pipe as these four board members are adhered.

Configurations of the cavity, the grooves, and the hollow formed in the board members 10, 20, 30 and 40 will be described more in detail with reference to the FIGS. 3 and 4.

Figure 3:
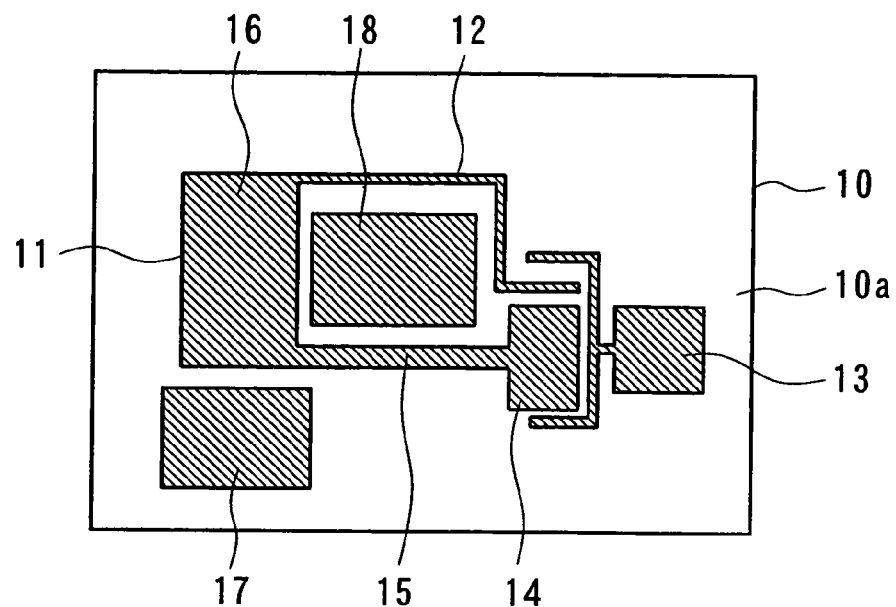
FIG. 3 is a top plan view showing a lower board member in the cooler embodying the invention.

As shown in FIG. 3, the lower board member 10 has the cavity portion 11 at its surface 10a This cavity portion 11 has a major empty space comprising a portion forming a passage for flowing working liquid and a vapor and a portion serving as a storage tank for supplying the working liquid. With reference to more detailed explanation of the configuration thereof the portion forming the passage 12 for flowing the working liquid such as water is provided, and the liquid is introduced into the board member 40 for the wick part, which will be explained, through the passage 12. The introduced liquid is made evaporated through the board member 40 for the wick part and a vapor thus evaporated is then introduced into a portion forming a vapor receiver 14. The vapor is introduced through a portion forming a passage 15 into a condenser part 22 for transition from the vapor to liquid, and the condensed liquid is then moved to a portion forming low temperature part 16. It then returns to the passage 12. Thus, circulation from liquid to vapor and vice versa can be performed.

A reservoir 13 and a storage portion 17 keep the liquid stored. The liquid in the reservoir 13 is flowed into the vapor receiver 14 when an amount of liquid in the receiver 14 lowers below a set level. The liquid in the storage portion 17 is flowed into the low temperature part 16 when an amount of liquid in the low temperature part 16 lowers below a set level. Thus, the reservoir 13 and the storage portion 17 keep the liquid stored to prevent a space inside the heat pipe from being dried out so that the liquid can be flowed into the reservoir 13 and the storage portion 17 when necessary.

A heat insulation hall 18 exists at a center of the lower board member 10 and at a location adjacent to the passages 12, 15. This prevents the heat from being diffused.

Figure 4:
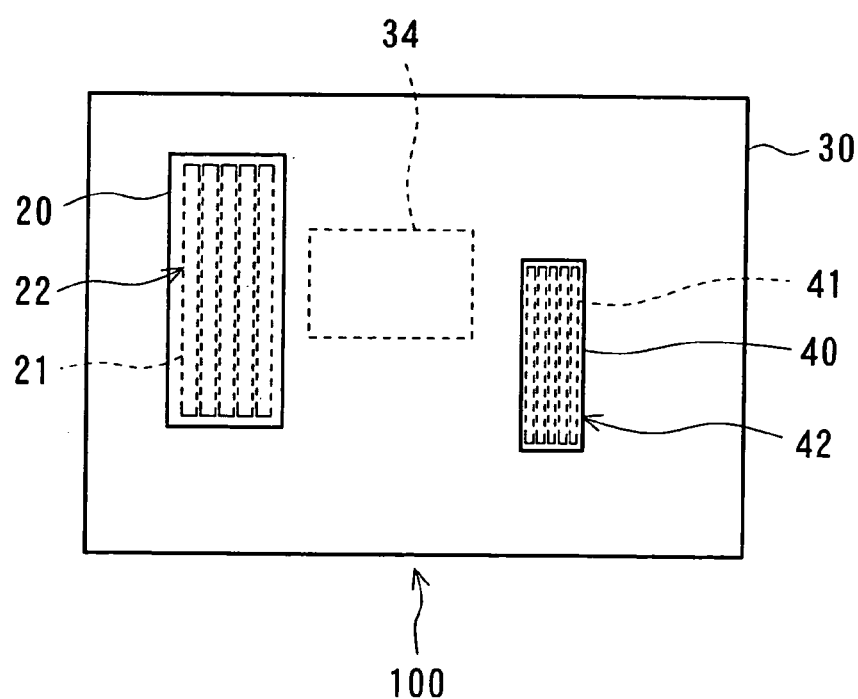
FIG. 4 is a top plan view showing upper complex board members in the cooler embodying the invention.

As shown in FIG. 4, the upper board member 30 incorporates the board member 20 for the condenser part and the board member 40 for the wick part, respectively, thereby forming an upper complex board member 100.

The board member 20 for the condenser part has a groove 21 on its surface 20b. The groove 21 serves as the condenser part for allowing the vapor introduced via the passage 15 to be condensed to the liquid and circulates it to the low temperature part 16.

The board member 40 for the wick part has a groove 41 on its surface 40b. The groove 41 serves as the cooler part for allowing the liquid introduced via the passage 12 and the reservoir 13 to be vaporized and the vapor thus vaporized to be flowed into the receiver 14.

A heat insulation hall 34 exists at a location opposed to that of the above heat insulation hall 18. The respective upper and lower board members 10, 30 have the heat insulation halls 18, 34 as a hollow and a cavity, for preventing the heat from being diffused.

Figure 5:
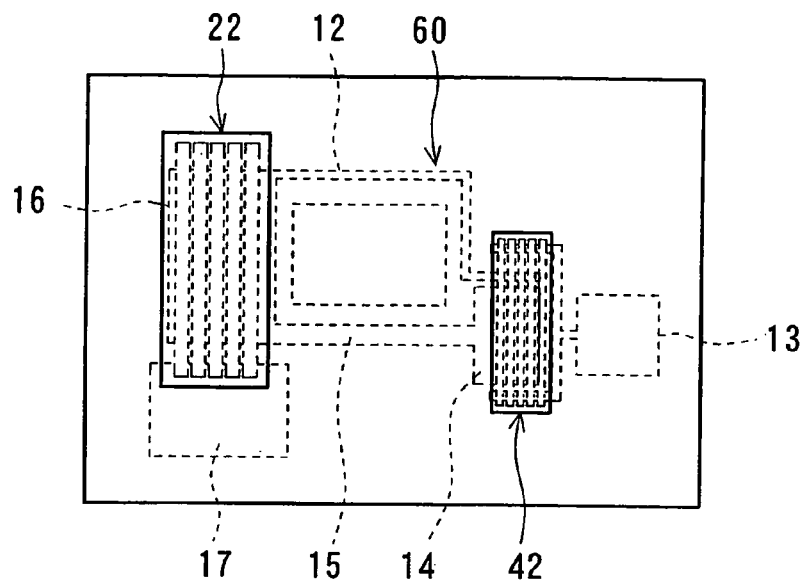
FIG. 5 is a top plan view showing an assembled condition of the upper complex board members and the lower board member in the cooler embodying the invention.

FIG. 5 shows an adhered condition of the upper complex board member 100 and the lower board member 10 through the silicon member 50 as shown in FIG. 2.

The heat pipe formed as the upper complex board member 100 and the lower board member 10 are adhered is filled with the working liquid. The filled liquid is circulated inside the heat pipe with making a liquid to vapor transition or a vapor to liquid transition. This allows the heat to be transferred, thereby serving as the cooler 1.

The circulation from the liquid to the vapor and vice versa will be explained with starting at the passage 12 for convenience of explanation.

The liquid, first, flows from the passage 12 into the wick part 42. When an amount of liquid flowed into the wick part 42 lowers below a set level at this time, the reservoir 13 supplies the sufficient liquid thereto to order to avoid drying out the heat pipe.

In the wick part 42, the flowed liquid is heated and boiled. The vapor evaporated according to the boil flows into the reservoir 14. The vapor then flows through the passage 15 into the condenser part 22 for condensing it to the liquid. Thus, the condensed liquid flows into the low temperature portion 16 positioned below the condenser part 22. The liquid again flows from the low temperature portion 16 to the passage 12 to circulate it. When an amount of liquid flowed from the low temperature portion 16 to the passage 12 lowers below a set level, the storage portion 17 allows the stored liquid to flow into the low temperature portion 16.

Although the embodiment using the board members made from the plastic material has been explained, the board member made from the glass material or a combination of the plastic material and the glass material may be used instead thereof.

Although the embodiment using the board member 20 for the condenser part and the board member 40 for the wick part each made from nickel has been explained, cooper can be used for them.

Figure 6A:
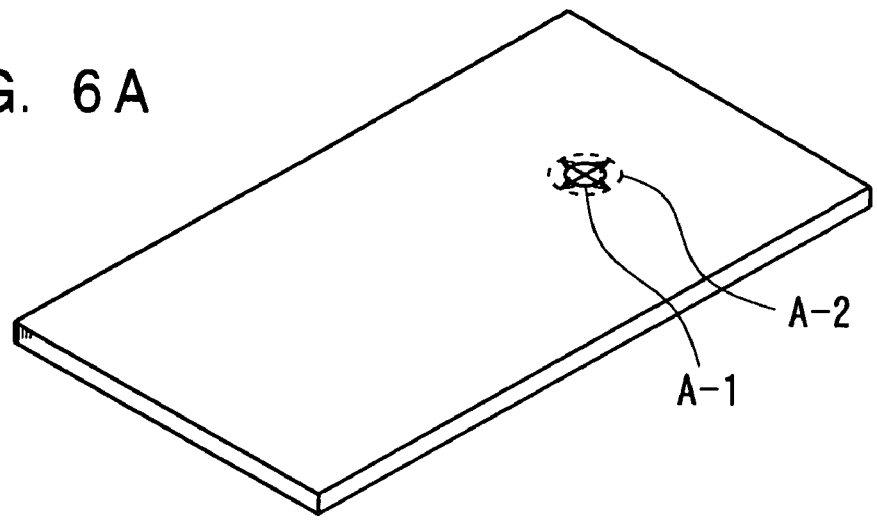
FIG. 6A is a diagram showing an area where heat is diffused as plastic board member is used.
Figure 6B:
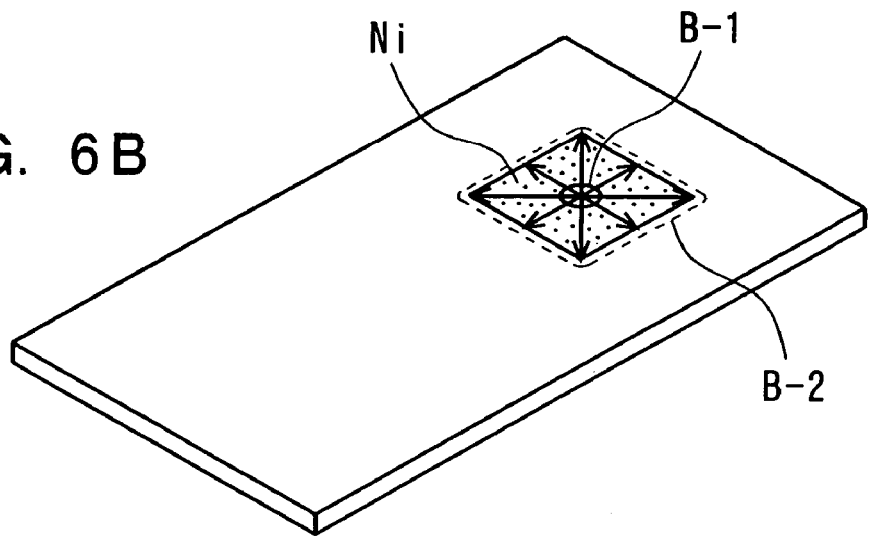
FIG. 6B is a diagram showing an area where heat is diffused as complex board members made from plastic material and metallic material are used according to the invention.

FIGS. 6A and 6B are diagrams for comparing the board member made from plastic material and the complex board member of the plastic material and the metallic material according to the invention in terms of the heat diffusion, each schematically showing an area where heat is diffused for a set time on the board member. FIG. 6A shows an area where the heat is diffused as the board member made from plastic material is used. FIG. 6B shows an area where the heat is diffused as the complex board members made from the plastic material and the metallic material are used with the plastic board member incorporating the metal such as nickel.

If the board member is made from the plastic material, as shown in FIG. 6A, the heat from heat source (the wick part) A-1 diffuses in a little area in the directions indicated by arrows (A-2). On the other hands, if the complex board member made from the plastic material and the metallic material is used as shown in FIG. 6B, the heat from heat source (the wick part) B-1 highly diffuses in a metallic portion but little heat diffuse in the plastic portion around the metallic portion (B-2).

The wick part is required for having thermal conductivity higher than a set level in order to serve as the heat pipe. Since the board member made from the plastic material, as shown in FIG. 6A, has little conductivity, it does not sufficiently serve as the heat pipe. On the other hands, in the complex board member made from the plastic material and the metallic material, as shown in FIG. 6B, according to the invention, the heat is sufficiently transferred in the wick part but it is hard to diffuse in the plastic portion around the wick part. This means that the heat concentrates in the wick part, thereby sufficiently serving as the heat pipe.

(A Method for Fabricating the Cooler)

Figure 7:
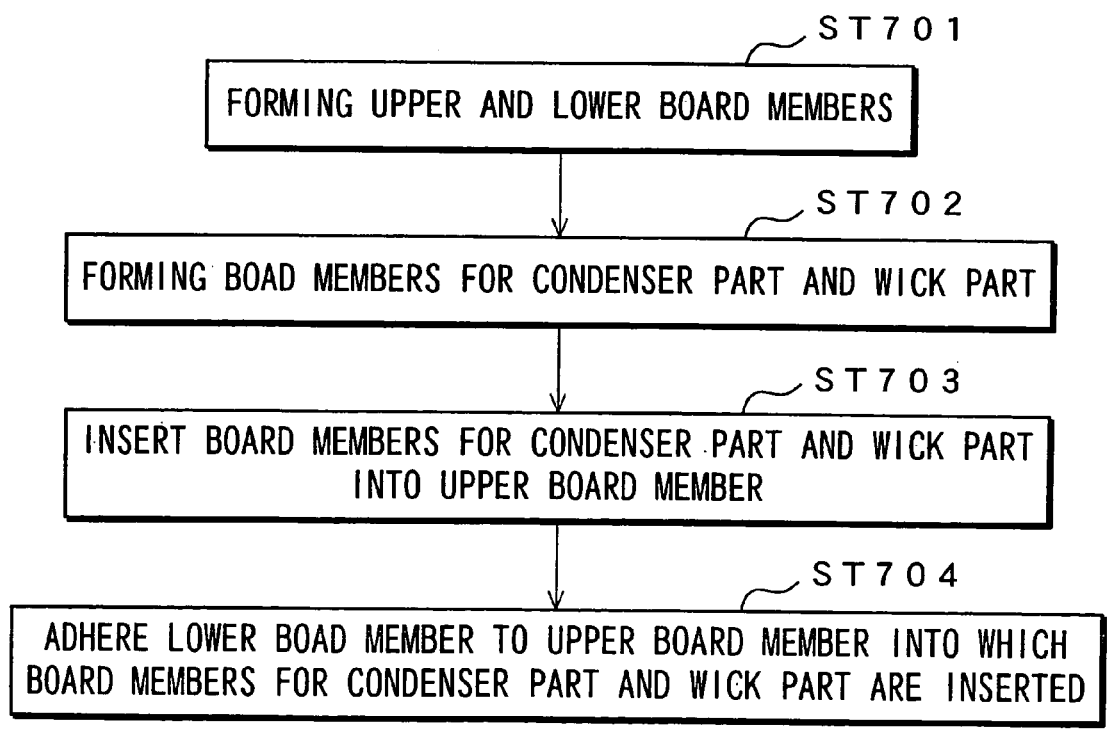
FIG. 7 is a flow diagram showing a fabrication method for fabricating the cooler of the invention.

FIG. 7 shows a fabrication method for fabricating the cooler.

The lower board member 10 and the upper board member 30 are first formed so that the cavity and hollow portions can be served as the heat pipe (Step 701). The cavity portion 11 working as a passage, a storage tank for storing working liquid, and a heat insulation hall is formed on the surface 10a of the lower board member 10 made from the plastic material. The hollow portion 31 working as a heat insulation hall is formed on the surface 30b of the upper board member 30 made from the plastic material. As the method for forming these cavity and hollow portions, it is conceivable that a mould for each of the board members is previously made, and the board members may be shaped into a particular form using the mold. The upper and lower board members may be made from glass. If so, the cavity and hollow portions may be etched into a piece of glass after patterning thereof.

Next, the board member 20 for the condenser part and the board member 40 for the wick part are formed (Step 702). Each of the board members 20, 40 that have grooves is formed according to the so-called UV-LIGA, for example.

Detailed steps of the UV-LIGA will be explained with reference to FIGS. 8A through 8D.

Figure 8A:
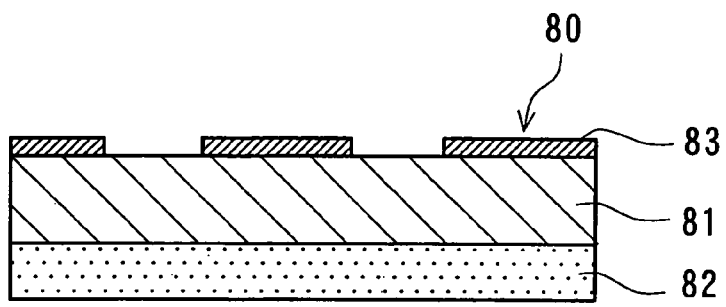
FIG. 8A is a schematic diagram illustrating a step for forming a groove on each of the board members for the condenser and the wick, respectively, used in the cooler of the invention.

Photoresist layer 81 made from organic material such as SU-8 is first formed on a plate 82 and patterned photoresist film 83 is then formed on the layer 81, as shown in FIG. 8A. They are referred to as a pattern board 80.

Figure 8B:
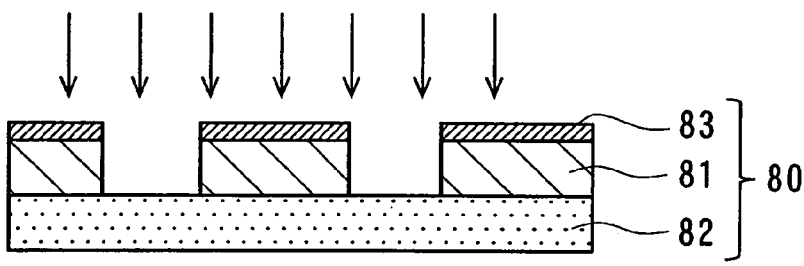
FIG. 8B is a schematic diagram illustrating a step for forming a groove on each of the board members for the condenser and the wick, respectively, used in the cooler of the invention.

The photoresist layer 81 is then etched applying ultraviolet light UV toward the pattern board 80 from above, as shown in FIG. 8B.

Figure 8C:
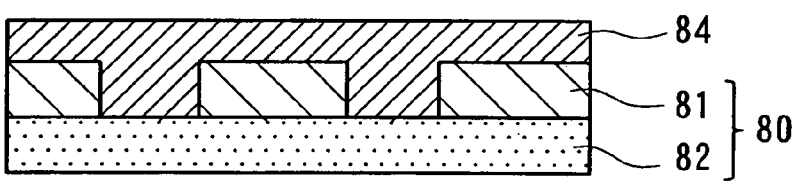
FIG. 8C is a schematic diagram illustrating a step for forming a groove on each of the board members for the condenser and the wick, respectively, used in the cooler of the invention.

Further, as shown in FIG. 8C, the photoresist film 83 is removed from the pattern board 80 and nickel layer 84 is then formed on a surface thereof by electroforming of nickel Ni.

Figure 8D:
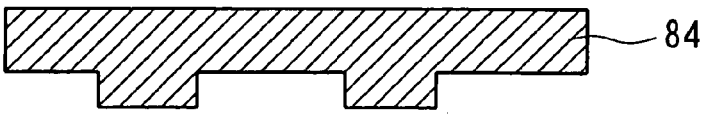
FIG. 8D is a schematic diagram illustrating a step for forming a groove on each of the board members for the condenser and the wick, respectively, used in the cooler of the invention.

Next, as shown in FIG. 8D, the nickel layer 84 is removed from the pattern board 80. Accordingly, the nickel layer thus removed becomes available for the board member 20 for the condenser part and the board member 40 for the wick part, which have grooves.

Figure 9:
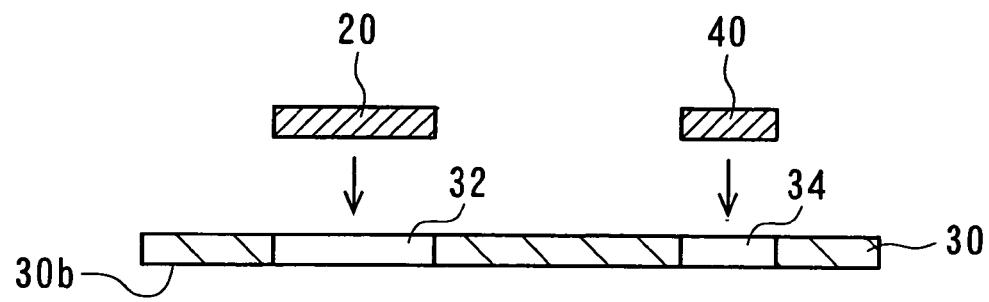
FIG. 9 is a schematic diagram illustrating a step for making board members for the condenser and the wick, respectively, incorporated to the upper board member used in the cooler of the invention.

The board members 20, 40 thus formed are inserted into the openings 32, 34 opened through the upper board member 30 as shown in FIG. 9 (Step 703). When the upper board member 30 made from plastic material is heated resulting in semi-solid condition, the board member 20 for the condenser part and the board member 40 for the wick part are inserted into the openings 32, 34 of the upper board member 30 thus heated to make the board members 20, 30, and 40 integral without a crack.

Figure 10A:
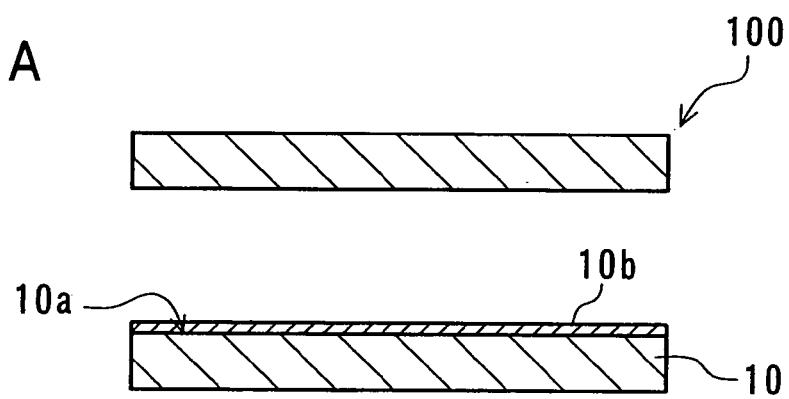
FIG. 10A is a schematic diagram illustrating a step for adhering the upper complex board member to the lower board member, both members being used in the cooler of the invention.
Figure 10B:
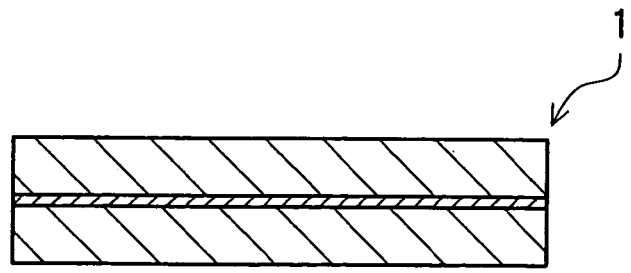
FIG. 10B is a schematic diagram illustrating a step for adhering the upper complex board member to the lower board member, both members being used in the cooler of the invention.

Additionally, as shown in FIG. 10A, a copper thin film 10b as an adhesive member is formed on the surface 10a of the lower board member 10 using, for example, the spattering. The lower board member 10 and the upper complex board member 100 are then bonded to each other using, for example, an ultrasonic bonding or a heat fusion bonding (Step 704).

The above method allows the heat pipe to be effectively fabricated.

(Another Embodiment of Cooler)

Figure 11:
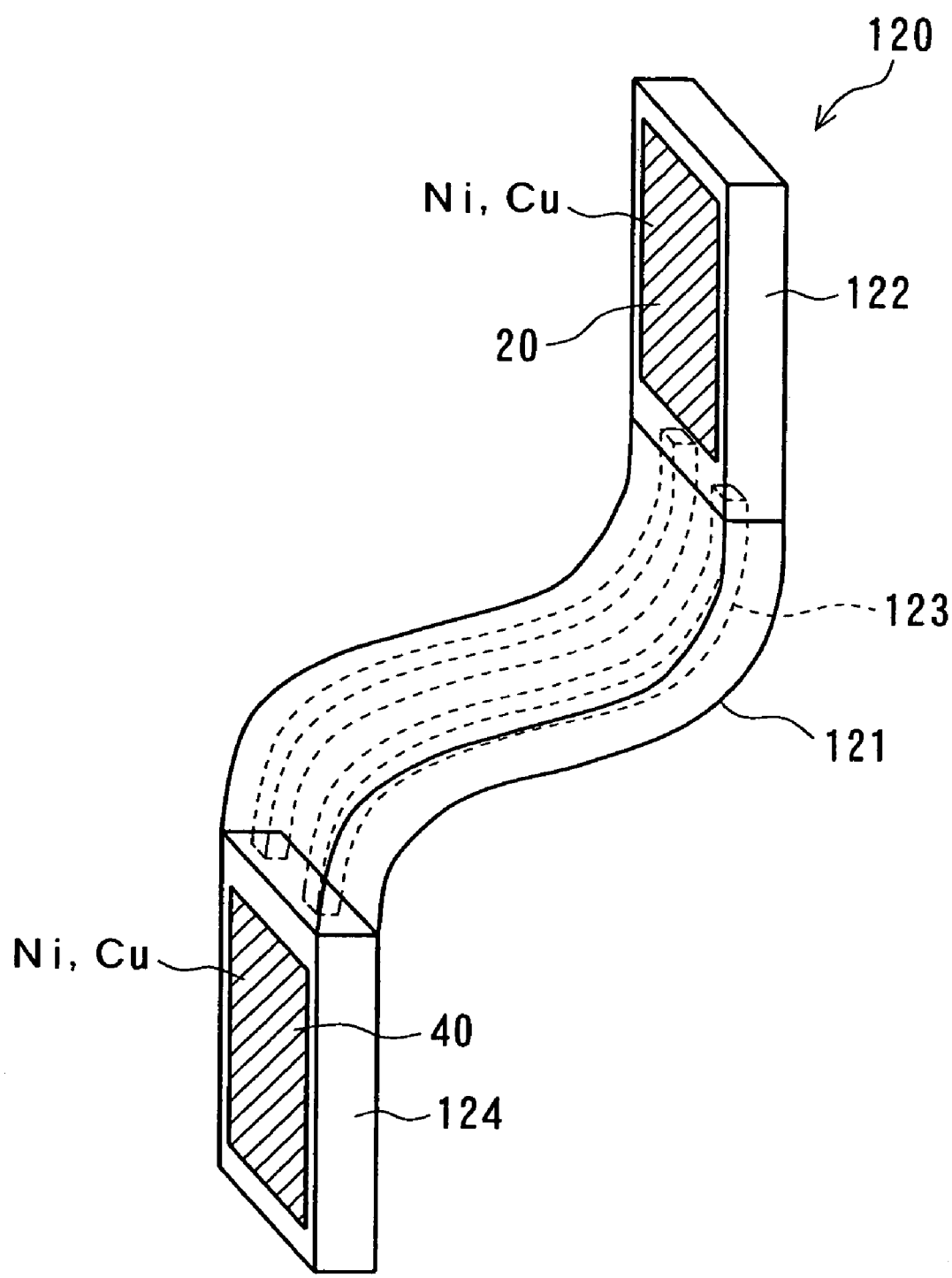
FIG. 11 is a schematic diagram illustrating another cooler embodying the invention.

FIG. 11 illustrates a flexible cooler 120 comprising a board device 122 for a condenser part, a board device 124 for wick part, and a flexible board member 121 connecting the board devices 122 and 124.

The board device 122 for the condenser part and the board device 124 for wick part are respectively made from plastic materials, into which the board member 20 for the condenser part and the board member 40 for the wick part are respectively inserted according to the above method.

The flexible board member 121 is made from plastic material and includes a passage 123 for heat pipe. The heat pipe is formed with these board member and devices being made integral.

The flexible board member 121 is made flexible without restraint. It is illustratively capable of equipping its board device 124 for the wick part for a heat source portion of an electronic apparatus and closely connecting the flexible board member along an outer surface of the electronic apparatus.

According to the cooler having such the configuration, the heat pipe may be effectively equipped even when the space therefor is limited, thereby allowing the electronic apparatus to be downsized and low-profiled.

(Electronic Apparatus)

FIG. 12 is a schematic perspective view of a personal computer equipped with a cooler according to the invention.

The personal computer 130 has a slot 131 for inserting and withdrawing storage medium 134 having a flush memory 133 and a driver 132. The cooler 135 of the invention is placed in the personal computer 130 with its wick part being illustratively situated directly under the driver 132 as the storage medium 134 is inserted into the personal computer through the slot 131.

Although the electronic apparatus has been explained as the personal computer, the cooler according to the invention may be used for other electronic apparatus such as digital cameras and video cameras.

(Others)

Although it has been explained according to the above embodiments of the invention that the upper board member 30 and the lower board member 10 are made from plastic or glass material and the board members 20, 40 for the condenser part and the wick part are made from metallic material, this invention is not limited thereto. The invention has such a feature that each of the board members 20, 40 has a grater (higher) thermal conductivity than the upper and lower board members 10, 30 have.

The following table 1 illustratively indicates materials suitably applied for the board members 20, 40 for the condenser part and the wick part and their thermal conductivity. The following table 2 illustratively indicates materials suitably applied for the upper and lower board members 10, 30 and their thermal conductivity.

TABLE 1

| MATERIALS | THERMAL CONDUCTIVITY (Wm$^{-1}$K$^{-1}$) |
| --- | --- |
| Silicon | 168 |
| Aluminum | 240 |
| Copper | 395 |
| Nickel | 83 |
| Iron | 72 |
| Titanium | 17 |
| Special Plastic | 100 |

TABLE 2

| MATERIALS | THERMAL CONDUCTIVITY (Wm$^{-1}$K$^{-1}$) |
| --- | --- |
| Pyrex Glass | About 1 |
| Plastic | About 1 |

Further, special plastic having more than 100 times the thermal conductivity of conventional plastic has been recently developed by mixing good thermal conductive ceramic powder and low temperature soluble alloy powder with granular plastic raw material, heating and molding them. Thus, it is conceivable that, if such the special plastic is used for materials for the board members for the condenser part and the wick part, and plastic or glass having a normal thermal conductivity such as Pyrex (registered trademark) glass is used for materials for the upper and lower board members, the board members for the condenser part and the wick part have grater thermal conductivity than the upper and lower board members have.

Note that, if plastic or glass having a normal thermal conductivity such as Pyrex glass is used for materials for the upper and lower board members, the board members for the condenser part and the wick part may have more than 10 times the thermal conductivity of the upper and lower board members when the board members for the condenser part and the wick part are made from titanium.

Similarly, if the board members for the condenser part and the wick part are made from iron or nickel, they may have more than 50 times the thermal conductivity of upper and lower board members. Additionally, if the board members for the condenser part and the wick part are made from the above special plastic, aluminum or silicon, they may have more than 50 times the thermal conductivity of upper and lower board members. Further, if the board members for the condenser part and the wick part are made from copper, they may have more than 300 times the thermal conductivity of upper and lower board members.

As described above, according to the invention, it is possible to provide the cooler having an excellent cooling performance, which is capable of being downsized and low-profiled, an electronic apparatus, and a method for fabricating the cooler.

INDUSTRIAL APPLICABILITY

As described above, the present invention is useful when it is applicable to a compact cooler for cooling card-typed storage medium. The present invention is also useful when it is applicable to a compact electronic apparatus such as note-typed personal computer, and digital cameras, which include the card-typed storage medium. The present invention is further useful when it is applicable to a method for fabricating a compact cooler for cooling card-typed storage medium

The invention claimed is:

1. A method for manufacturing a cooler comprising the steps of:
   forming a first board member having a cavity portion on a surface thereof, said cavity corresponding to a part of a heat pipe excluding at least a wick part therefrom;
   forming a second board member having at least a groove for the wick part on a surface thereof, said second board member comprising a material having higher thermal conductivity than the thermal conductivity of said first board member;
   incorporating said second board member into a third board member through a surface thereof; and
   adhering a surface of the third board member to a surface of the first board member.

2. The method according to claim 1 further comprising:
   forming a fourth board member having at least a groove for a condenser part on a surface thereof, said fourth board member comprising a material having higher thermal conductivity than that of said first board member; and
   incorporating said fourth board member into said third board member through a surface thereof.

3. The method according to claim 1, wherein said second board member is manufactured according to a UV-LIGA process.

4. The method according to claim 1 further comprising forming adhesive members on any of the surfaces of said first and third board members to adhere said first and third board members to each other.

* * * * *